/ United States Patent (12) Yang

(10) Patent No.: US 7,525,317 B2
(45) Date of Patent: Apr. 28, 2009

(54) REAL-TIME MULTI-POINT GROUND RESISTANCE MONITORING DEVICE

(75) Inventor: Hsin-Ming Yang, Hsien (TW)

(73) Assignee: Ellison Yang, Chung He, Taipei Hsien (TW)

( * ) Notice: Subject to any disclaimer, the term of this patent is extended or adjusted under 35 U.S.C. 154(b) by 224 days.

(21) Appl. No.: 11/544,920

(22) Filed: Oct. 10, 2006

(65) Prior Publication Data

US 2007/0210808 A1 Sep. 13, 2007

(30) Foreign Application Priority Data

Mar. 2, 2006 (TW) .............................. 95106996 A

(51) Int. Cl.
*G01R 31/14* (2006.01)
*G01R 27/08* (2006.01)
*G08B 21/00* (2006.01)

(52) U.S. Cl. .................. 324/509; 324/691; 340/649

(58) Field of Classification Search ................... 324/509
See application file for complete search history.

(56) References Cited

U.S. PATENT DOCUMENTS 3,569,826 A * 3/1971 Burnett ....................... 361/170

5,376,920 A * 12/1994 Baily ........................... 340/654
5,623,255 A    4/1997 Yang et al.
5,909,181 A *  6/1999 Golzmane .................... 340/649
6,819,122 B2 * 11/2004 Slates ........................... 324/699
6,930,490 B2 *  8/2005 Saunders et al. ............. 324/511
7,023,680 B1 *  4/2006 Johnson et al. .............. 361/111
2006/0092600 A1 *  5/2006 Ewing et al. ................. 361/626

FOREIGN PATENT DOCUMENTS

TW          448414         8/2001

* cited by examiner

*Primary Examiner*—Diego Gutierrez
*Assistant Examiner*—Jeff Natalini
(74) *Attorney, Agent, or Firm*—Birch, Stewart, Kolasch & Birch, LLP

(57) ABSTRACT

A real-time multi-point ground resistance monitoring device is provided herein to simultaneously monitor ground resistances of different work stations. The present invention mainly contains a number of monitoring ports connected to multiple test ground points in parallel via conductive wires respectively. Each monitoring port is configured with a safety range of acceptable ground resistances and a presentation manner of the alarm when the measured ground resistance of a monitoring port exceeds the safe range. The monitoring device has a self-correction function to automatically offset the resistance of conductive wire from the measurement result when the conductive wire is too long. The monitoring device can further contain a network interface allowing remote operation and monitoring.

9 Claims, 8 Drawing Sheets

REAL-TIME MULTI-POINT GROUND RESISTANCE MONITORING DEVICE

BACKGROUND OF THE INVENTION

1. Field of the Invention

The present invention generally relates to ground resistance monitoring devices, and more particularly to a ground resistance monitoring device capable of monitoring ground resistances of multiple work stations simultaneously in real time.

2. The Prior Arts

Grounding is often considered an extremely important issue in preventing electrostatic hazard. However, despite the technology advances, achieving a reliable and effective grounding still seems a difficult job. Accidents due to improper grounding are still quite often, even for high-tech manufacturers. Electrostatics, if not treated seriously and cautiously, could cause severe property loss and human lives too.

In a conventional work place, there are usually multiple assembly lines each containing a number of assembly stations or machines. To prevent the electrostatics carried by the operators working in these assembly lines from damaging the products in production, the operators are usually required to wear electrostatic-proof clothes, shoes, and/or wrist strap, and the floor and the table surface are usually covered with floor mats or table mats to prevent the accumulation of electrostatics. As shown in FIG. 1a, the floor mat 10, the table mat 20 and the wrist strap (not shown) are usually connected to a common point ground 30 in an assembly station. The common point ground 30 is usually a metallic plate or wire set up at a fixed location in the assembly station.

As shown in FIG. 1b, the common point grounds 30 of the assembly stations in an assembly line are series-connected by a conductive wire 40, and the conductive wires 40 of separate assembly lines are jointed together or separately connected to either an equipment ground or an earth ground (independent of the equipment ground).

The equipment ground is usually the ground provided by the ground wire of the AC (alternate current) mains. When a building is constructed, one or more ground bars are hammered into the ground to form a ground net 70. The ground wire of the AC mains is then connected to the ground net 70. The ground of the AC mains is then branched to the power outlets through the panel box 50 at each floor and a major panel box 60 of the building. The earth ground is usually connected to an additional and independent ground bar or ground net. In either way, electrostatics carried by or accumulated on the operators are conducted to earth through the wrist straps, the table mats, the floor mats, to the common point grounds in assembly stations, and then to the equipment ground of the building or the independent earth ground, so as to prevent potential electrostatic hazard.

The foregoing grounding structure is also commonly found in production lines with a number of working machines, such as the surface mounting machines, and these working machines are usually connected to the equipment ground through their power cables respectively. Besides assembly lines, the service islands of a gas station have a similar environment. Each service island has a number of gasoline pumps each of which has several hoses to provide different kinds of gasoline. The nozzles of the hoses are connected to a conductive wire of the gasoline pump, and the conductive wires of the gasoline pumps of a service island is series-connected to a ground bar or a ground net of the gas station.

For assembly lines, production lines, service islands, or any other similar working environments, they all contain a number of work stations (hereinafter, the term is used to refer to assembly stations, machines, gasoline pumps, or any other similar spots requiring appropriate grounding) which should be properly grounded to prevent electrostatic hazard. However, it is quite often that these ground bars or ground nets are rust-eaten to provide proper grounding, or the panel boxes are not connected to the ground bar or ground net for some reason, or the conductive wires are broken. All these would cause one or more work stations to have inadequate grounding and therefore the electrostatics start to accumulate on the operators which will damage the product under production or even the expensive machines.

Conventionally, a common approach to the problem is to conduct periodic manual examination of the grounding of each work station. One manual examination method is the so-called three-point-grounding method by a specialized ground resistance measurement equipment. The three-point-grounding method is to connect two test leads of the equipment to two existing ground bars and then connect a third test lead of the equipment to the ground bar or ground net under test. As can be imagined, this method requires quite some effort and time, and only applicable to a limited number of environments. For ground points indoors or at higher floor locations, this method is not adequate. Moreover, this kind of periodic examination still cannot detect and resolve grounding problems happening during the window between two examinations.

There are quite a few other approaches proposed in the related arts. For example, a wrist strap disclosed in U.S. Pat. No. 5,623,255 would siren when it is disconnected from the common point ground. However, whether the common point ground indeed provides adequate grounding is still unknown. A monitoring device disclosed in R.O.C. (Taiwan) Patent No. 448,414 can automatically monitor and issue alarm when detecting abnormal grounding for a single ground point. To monitor multiple grounding points, multiple devices have to be prepared which is too costly and, on the other hand, lacks the convenience of centralized management.

Additionally, the existing techniques usually require a ground that is known to be appropriate as a reference. To locate and make sure the reference ground is indeed appropriate, the foregoing methods such as the three-point-grounding method has to be used, which adds a lot of trouble in setting up the monitoring devices. What is even more bothersome is that whether the reference ground remains effective may be an issue by itself and therefore may require periodic examination as well.

SUMMARY OF THE INVENTION

The present invention provides a real-time multi-point ground resistance monitoring device which can simultaneously monitor ground resistances of multiple work stations in real time.

A major feature of the present invention is to conduct the ground resistance measurement and monitoring by establishing a path through the earth between the ground point being monitored and the ground of the ubiquitous AC mains Another major feature of the present invention is that the reference ground provided by the AC mains can be easily and conveniently examined without requiring expensive test equipments and/or the conduction of demanding test methods.

Yet another major feature of the present invention is that the device can be calibrated to automatically offset the wire resistance when the connecting wire to the ground point being monitored is extended too long so as to achieve accurate measurements.

The real-time multi-point ground resistance monitoring device of the present invention contains a number of monitoring ports, each separately parallel-connected to the common point ground, equipment ground, or other appropriate ground of a work station trough a conductive wire. Each monitoring port can be configured with a specific safety range of acceptable ground resistances, and how to issue alarm when the measurement result exceeds the safety range. In addition, as the conductive wire can be extended for a considerable distance, each monitoring port has a self-correction function to offset the influence of the wire resistance of the extended conductive wire to the measurement result. The real-time multi-point ground resistance monitoring device also provides a network interface permitting remote users to monitor the ground resistances of multiple work stations through a network.

The real-time multi-point ground resistance monitoring device contains a processing unit, a display and operation unit, a testing and power supply unit, and a measurement unit The processing unit is the brain of the device which has two-way connections to the other units for data exchange. The display and operation unit is the man-machine interface for setting up parameters, presenting measurement results, and delivering alarms. The testing and power supply unit connects to an external AC mains, converts the AC power to appropriate voltages to drive the other units, and provides the ground of AC mains as a reference to the measurement unit for measuring the ground resistance at each monitoring port. To ensure the correctness of the measurements, another major function of the testing and power supply unit is to make sure that the AC mains has proper grounding and to obtain the ground resistance of the AC mains. The measurement unit, under the control of the processing unit, periodically measures the ground resistance at each monitoring port and passes the measurement results to the processing unit. The processing unit then compares the measurement results against their corresponding safety ranges and issues an alarm through the display and operation unit when an exceptional condition has been detected.

The real-time multi-point ground resistance monitoring device can further contains a network interface unit which network-enables the man-machine interface of the display and operation unit in the form of web pages or similar interface to authorized users accessing the monitoring device through a network, and therefore allows authorized users to set up device parameters or monitor measurement results through the network. Similarly, alarms from the processing unit can also be presented in the web pages or passed to specific users in appropriate manners.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

Figure 1A:
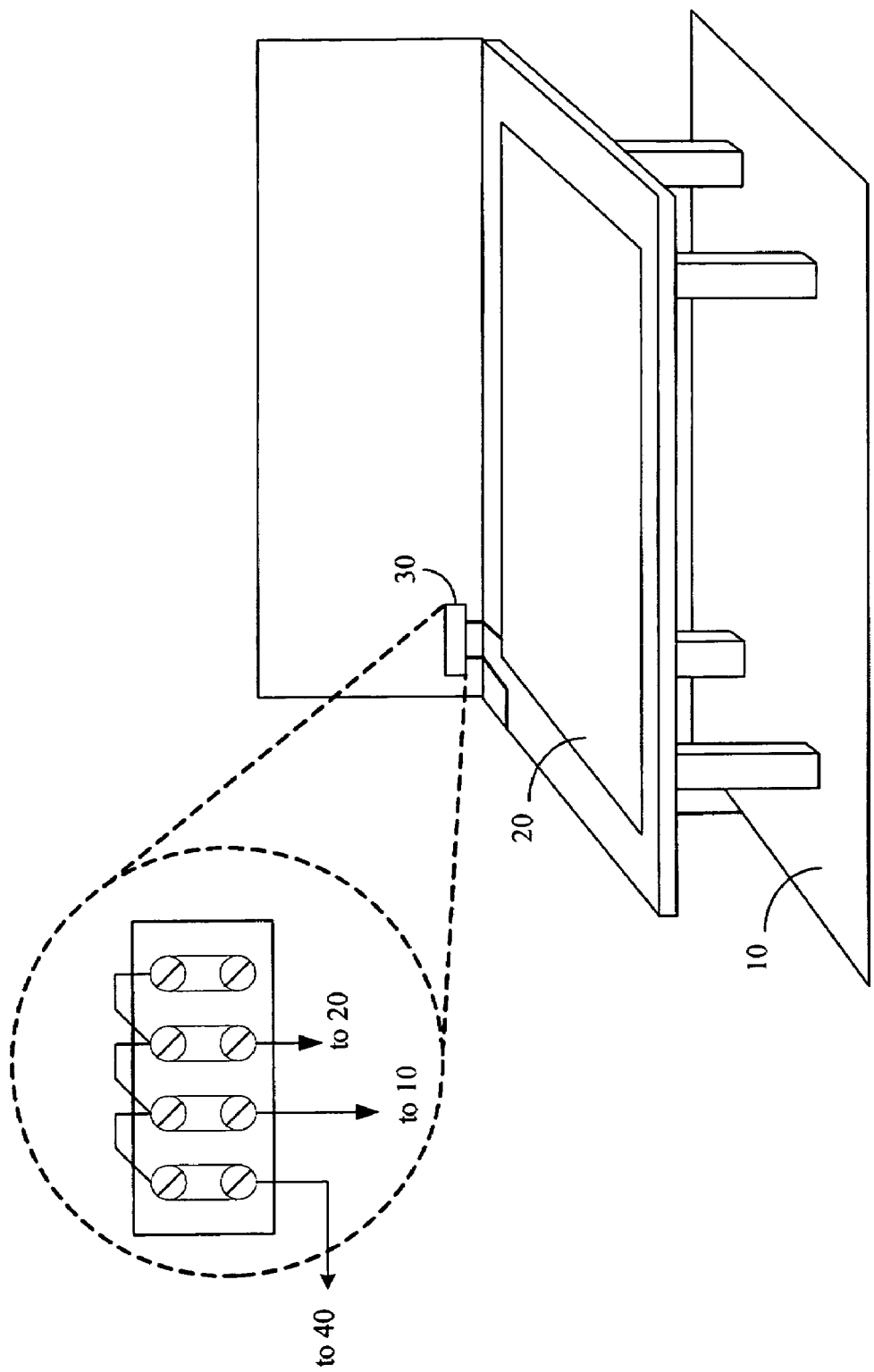
FIG. 1a is a schematic view showing the grounding of a conventional assembly station.
Figure 1B:
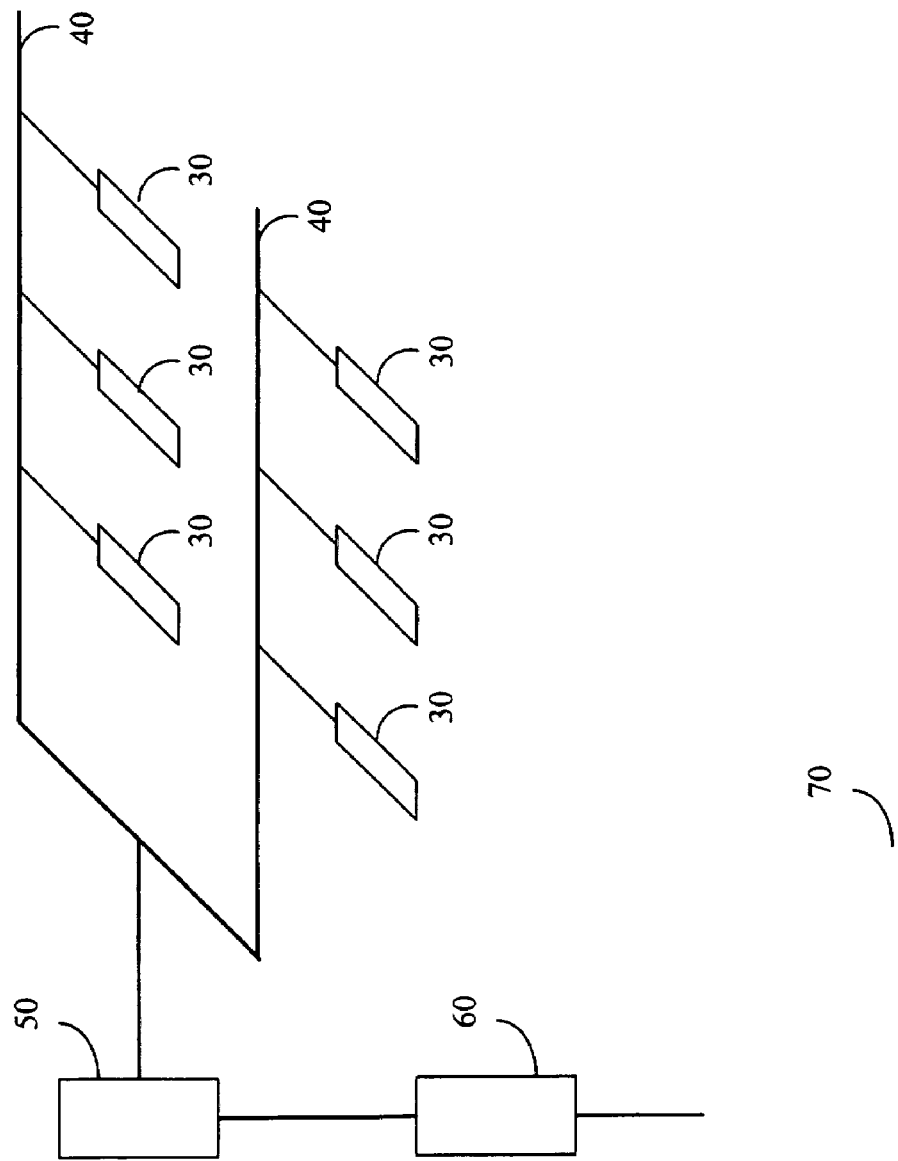
FIG. 1b is a schematic view showing the grounding of multiple assembly lines.
Figure 2A:
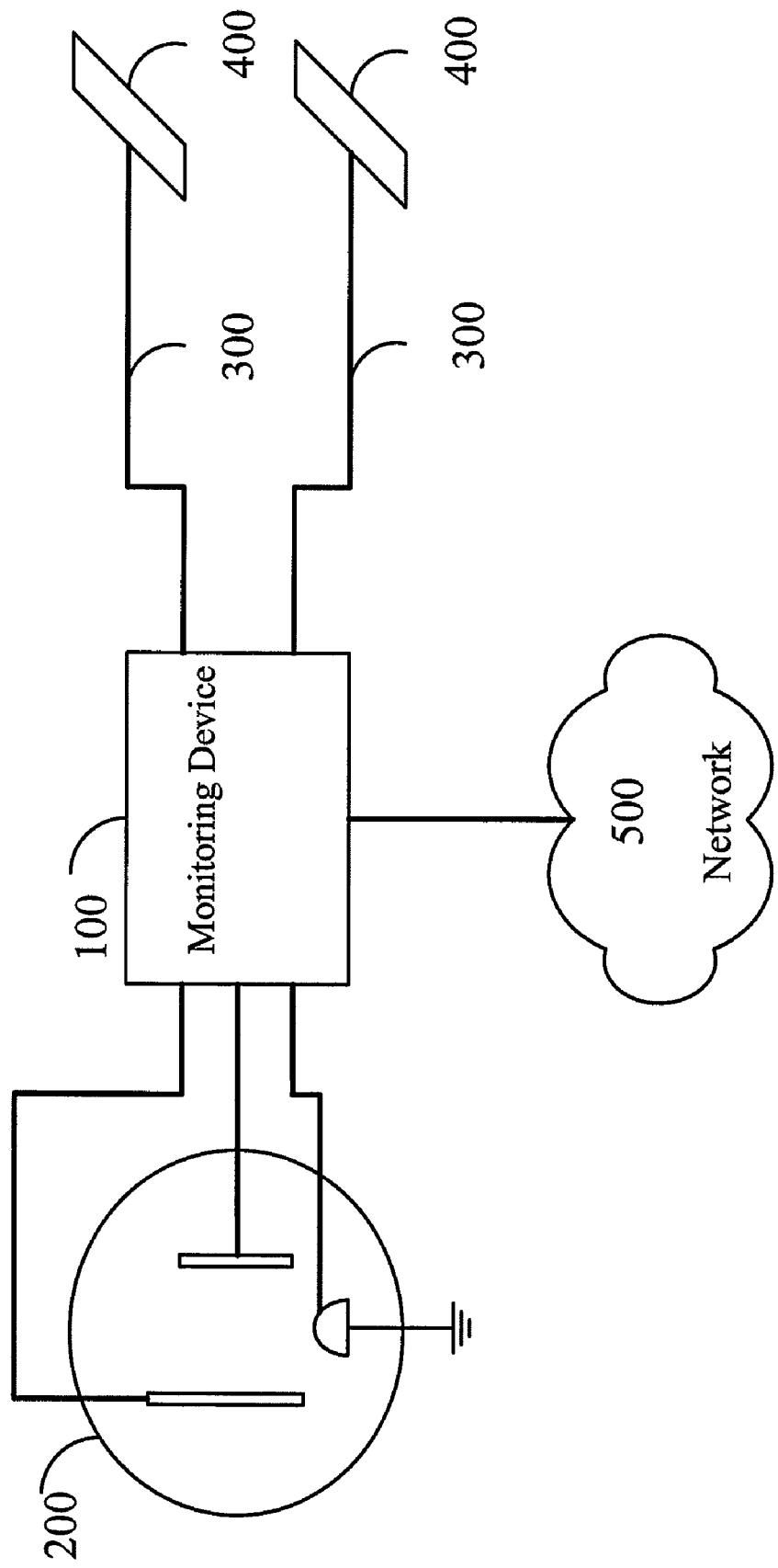
FIG. 2a is a schematic view showing the environment where a monitoring device according to the present invention functions.

FIG. 2a is a schematic view showing the environment where a monitoring device according to the present invention functions. As shown in FIG. 2a, a real-time multi-point ground resistance monitoring device 100 of the present invention is an independent device connecting to an AC mains 200 (usually a wall outlet providing 100V or 220V AC power) to extract the required power and utilizes the ground of the AC mains to establish an electrical path (more details will be given later). The monitoring device 100 parallel-connects to multiple ground points 400 through conductive wires 300 respectively to measure the ground resistances of the ground points 400. Each ground point 400 is a common point ground, an equipment ground, or other ground point requiring monitoring. As shown in FIG. 2a, the monitoring device 100 can further connect to a network 500 to provide remote operation and monitoring. The network 500 is an abstraction of any appropriate network. For example, it can be a wired or wireless local area network (LAN), a proprietary wide area network (WAN) or the Internet via a wired or wireless LAN, or a mobile data network (such as a 2.5 G or 3 G mobile communications network).

Figure 2B:
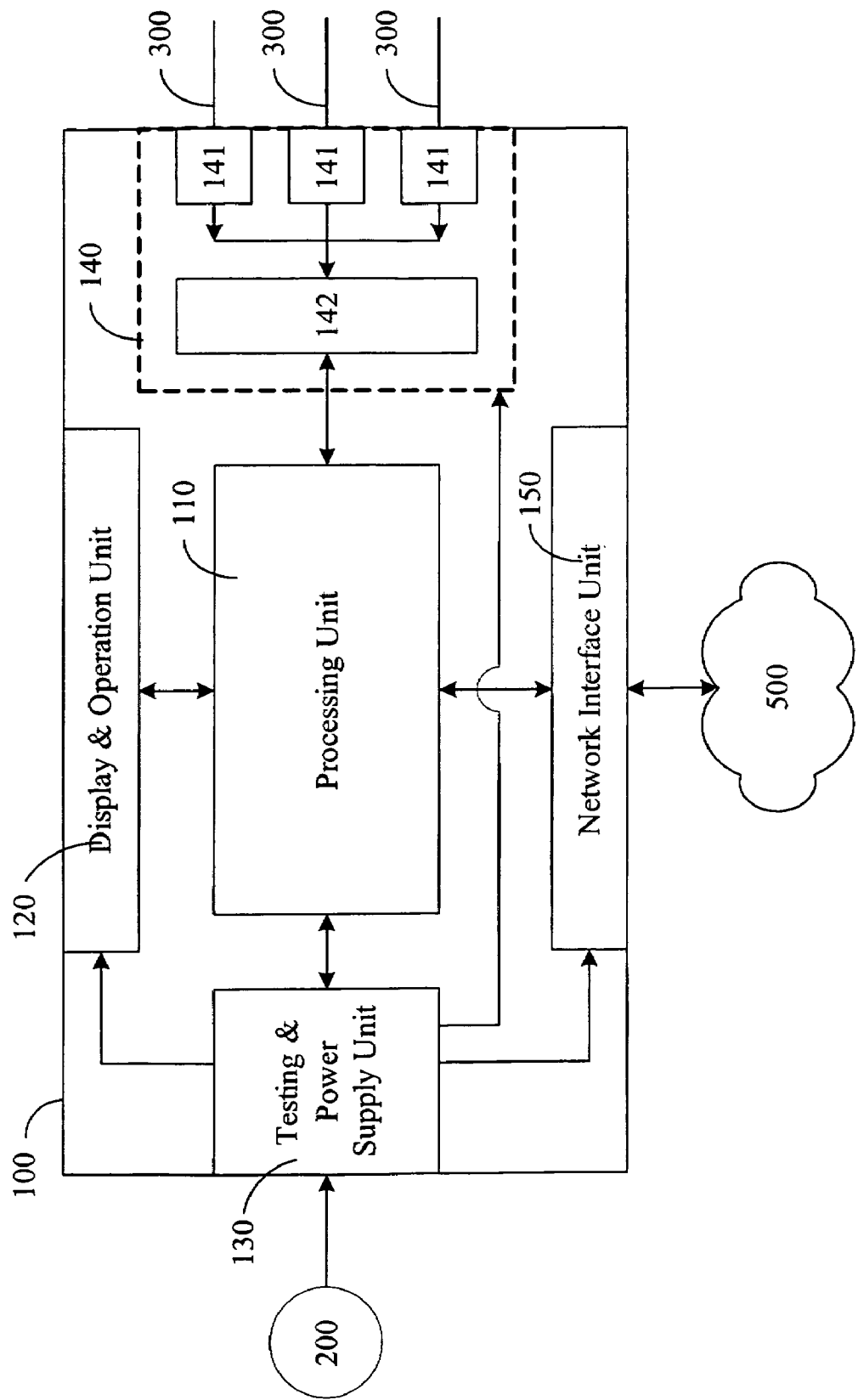
FIG. 2b is a functional block diagram showing an embodiment of the real-time multi-point ground resistance monitoring device of the present invention.
Figure 2C:
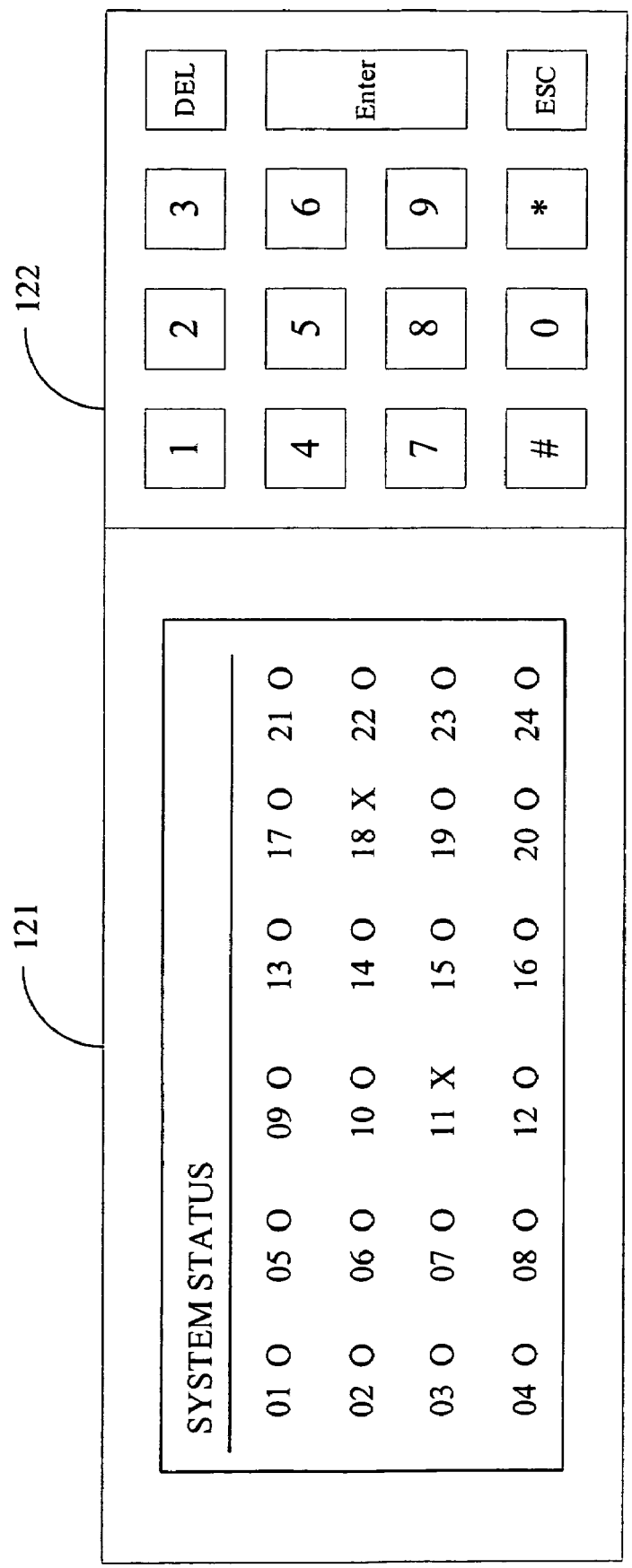
FIG. 2c is a schematic view showing an embodiment of the display and operation unit of the present invention.

FIG. 2b is a functional block diagram showing an embodiment of the real-time multi-point ground resistance monitoring device of the present invention. As shown in FIG. 2b, the real-time multi-point ground resistance monitoring device 100 mainly contains a processing unit 110, a display and operation unit 120, a testing and power supply unit 130, and a measurement unit 140. Among them, the display and operation unit 120 is the main man-machine interface of the monitoring device 100. FIG. 2c is a schematic view showing an embodiment of the display and operation unit 120 of the present invention. As shown in FIG. 2c, the display and operation unit 120 contains a display 121 and a keypad 122 on the enclosure of the monitoring device 100, allowing a user to set up device parameters and to view measurement results. In the embodiment shown in FIG. 2c, the display 121 presents measurement results of multiple monitoring ports of the monitoring device 100 with "O" as normal and "X" as abnormal. Please note that the embodiment shown in FIG. 2c is only exemplary, and the present invention is not limited to the embodiment shown in FIG. 2c only. The display and operation unit 120 can further contain other control and display means, such as flash lights, a buzzer, or a speaker to alarm the user when the monitoring device 100 detects some abnormal condition. The display and operation unit 120 can also contain an electrical or mechanical relay to trigger the operation of some external device.

The display and operation unit 120 is driven by the processing unit 110 through a connection therebetween. Through the connection, the display and operation unit 120 passes command inputted by the user back to the processing unit 110. The processing unit 110 is the core responsible for processing and computing data for the monitoring device 100, which has an ordinary computing structure including a processor, read-only memory, random access memory (RAM), input-output controllers, real-time clock, and buses, etc. The processing unit 110 has two-way connections with all other units to exchange data with each other. These details should be familiar to those skilled in the related arts and are omitted for simplicity.

Figure 2D:
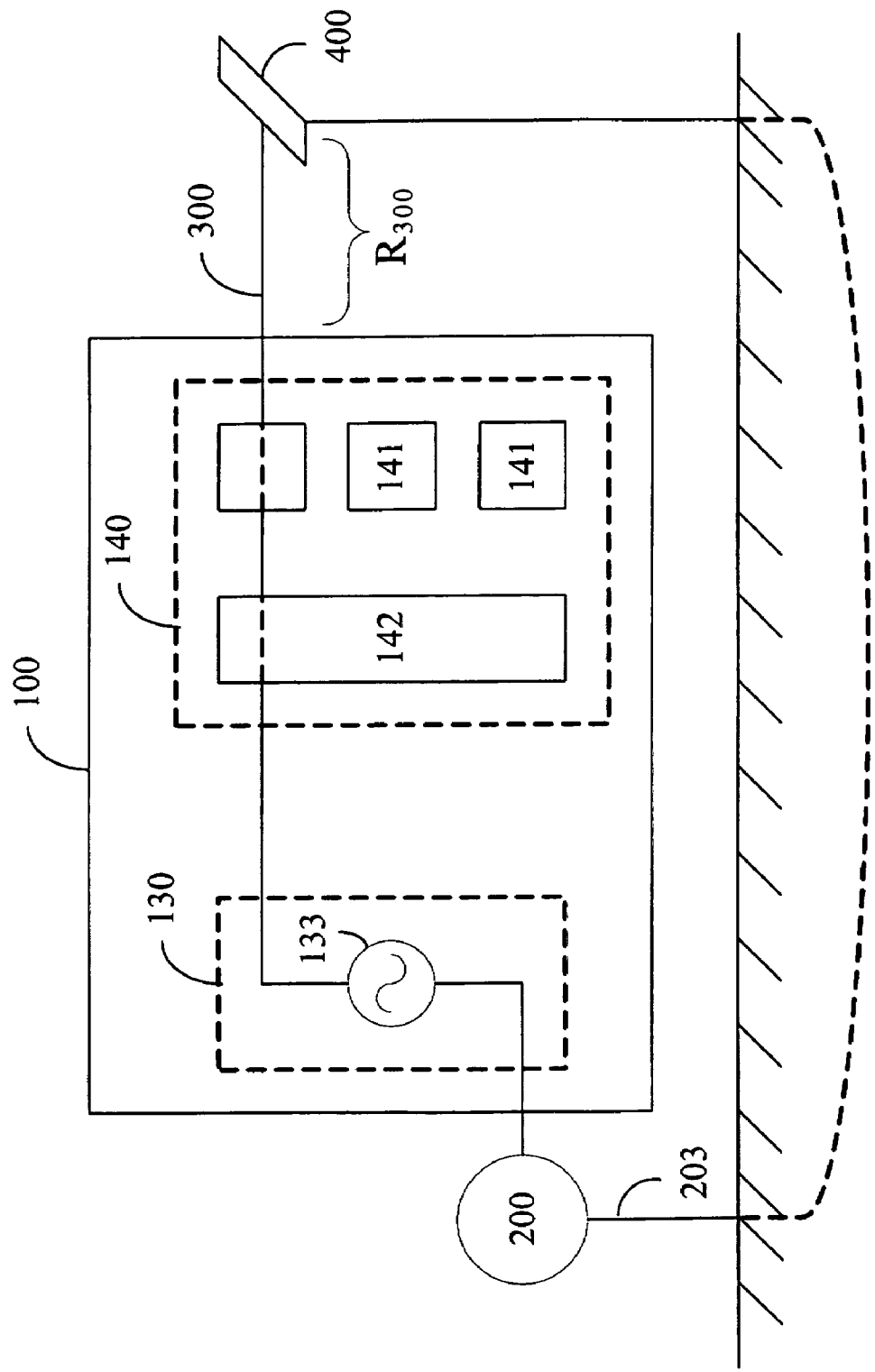
FIG. 2d is a schematic view showing how a test ground point is measured by the monitoring device of FIG. 2b.

The measurement unit 140 contains more or more monitoring ports 141 and a control interface 142. Each monitoring port 141 connects to a ground point 400 to be monitored (hereinafter, the test ground point) through a conductive wire 300. In turn, these monitoring ports 141 are connected to the control interface 142. The processing unit 110 periodically measures each test ground point 400 through the control interface 142. FIG. 2d is a schematic view showing how a test ground point is measured by the monitoring device of FIG. 2b. As shown in FIG. 2d, the processing unit 110 of FIG. 2b activates the control interface 142 to choose a specific monitoring port 141, and to connect the monitoring port 141 to an appropriate voltage source 133 provided by the testing and power supply unit 130 to form a electrical path from the voltage source 133, through the conductive wire 300, to the test ground point 400, and back to the voltage source 133 via the earth. The resistance of the entire path is: $R_{203}$ (ground resistance of the AC mains 200)+$R_{300}$ (resistance of the conductive wire 300)+$R_{400}$ (ground resistance of the test ground point 400). Whenever the test ground point 400 doesn't have proper grounding, this implies that the electrical path does not exist or the path has extremely large resistance. The measurement result obtained by the processing unit 110 therefore will have a very high vale and the conclusion that the test ground point 400 doesn't have proper grounding can be derived.

Figure 2E:
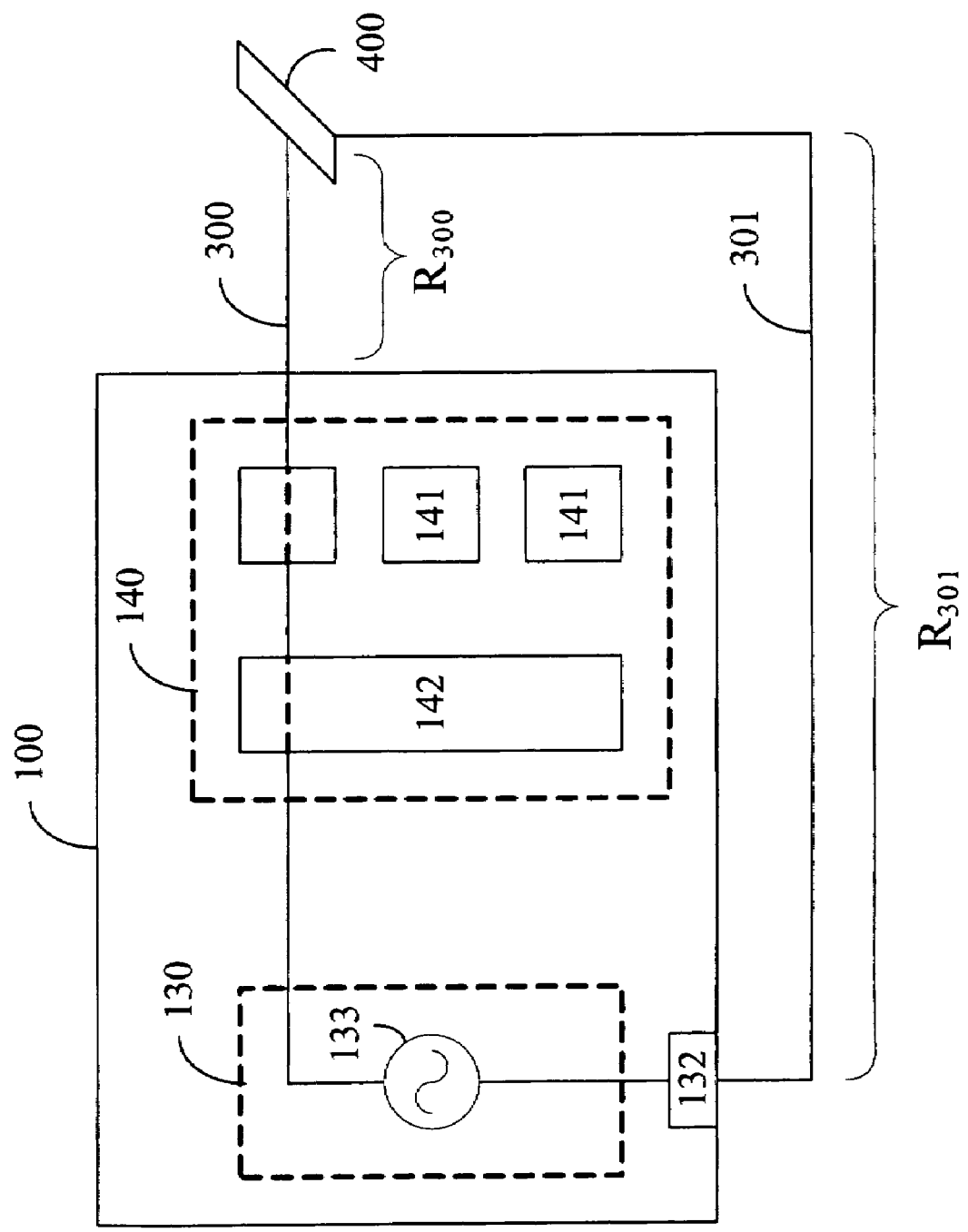
FIG. 2e is a schematic view showing how the resistance of a conductive wire is estimated by the monitoring device of FIG. 2b.

It can be seen from FIG. 2d that, if $R_{300}$ (resistance of the conductive wire 300) is very large, the processing unit 110 may reach a misjudgment. The present invention therefore provides each monitoring port 141 with a self-correction function whose proper operation requires an accurate estimation of $R_{300}$ (resistance of the conductive wire 300) in advance. FIG. 2e is a schematic view showing how the resistance of a conductive wire is estimated by the monitoring device of FIG. 2b.

Before going into the details about the estimation of the wire resistance, it has to be pointed out that the monitoring device 100 of the present invention contains a second ground port 132. In a special calibration mode of the monitoring device 100, the monitoring device 100 measures a test ground point through the second ground port 132, instead of through the ground of AC mains. The purpose of having the second ground port 132 is mainly that an existing known proper ground other than the one of the AC mains can be used for the multi-point ground resistance monitoring. Another purpose of having the second ground port 132 is then for the estimation of wire resistance as described here. In this special calibration mode, the monitoring device 100 connects another conductive wire 301 having substantially identical length and of substantial identical material with the conductive wire 300 to the same test ground point 400 through the second ground port 132 to form an electrical path. The resistance of the entire path is therefore: $R_{301}$ (resistance of the conductive wire 301)+$R_{300}$ (resistance of the conductive wire 300). Because the conductive wire 301 is substantially identical with the conductive wire 300, the processing unit 110 can simply divide the measurement result by two to obtain a rather accurate estimation of $R_{300}$.

The processing unit 110 keeps three parameters in a non-violate memory for each monitoring port 141: the resistance of the conductive wire connected to the monitoring port 141 whose default is zero, the minimum and maximum acceptable ground resistances of the test ground point 400 monitored through the monitoring port 141 (i.e., the safety range). The resistance of the conductive wire 300 is usually very small value and can be ignored (therefore, is default to be zero in the non-violate memory). However, if the conductive wire 300 is very long and has a large wire resistance to influence measurement result, the resistance of the conductive wire 300 has to be estimated through the foregoing calibration mode. The estimated wire resistance value is then entered by the user, or automatically recorded by the processing unit 110 into the non-violated memory. The wire resistance is then deducted by the processing unit 110 from its measurement result during the normal monitoring process. The processing unit 110 then compares the corrected measurement result against the safety range of the monitoring port 141 and issues an alarm when the measurement result exceeds the safety range.

Figure 2F:
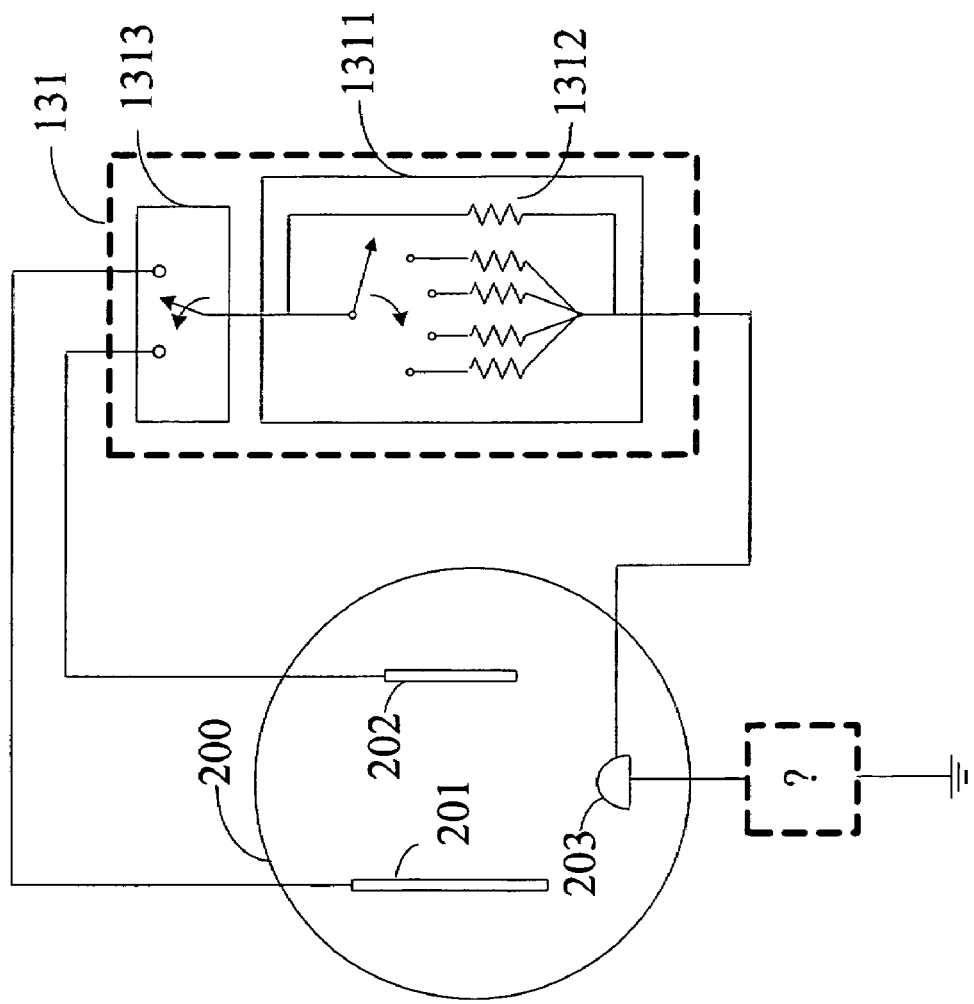
FIG. 2f is a schematic view showing an embodiment of the testing member of the present invention.

The testing and power supply unit 130 connects separately to the neutral lead 201, power lead 202, and ground lead 203 of the AC mains 200. From the power lead 202, the testing and power supply unit 130 extracts, regulates, and rectifies the AC power, and then provides appropriate voltages to the other units. The testing and power supply unit 130 itself contains a testing member 131 to examine the grounding of the AC mains 200 to see if it is proper, and to obtain the ground resistance of the AC mains (i.e., the aforementioned $R_{203}$). FIG. 2f is a schematic view showing an embodiment of the testing member 131 of the present invention. As shown in FIG. 2f, the testing member 131 mainly contains a loading element 1311 and a switch 1313. The loading element 1311 in turn contains a resistor 1312 having a very large resistance, and a resistor array (not numbered) parallel-connected to the resistor 1312. In the embodiment as shown in FIG. 2f, the resistor array is provided with four resistors having different resistances respectively, which include ∞ (i.e., open circuit), 1 MΩ, 5.6KΩ, and 200 Ω selected by an additional multi-step switch (not numbered) in the loading element 1311. Based on this design and the following table, the grounding condition of the AC mains 200 can be easily determined by observing whether current is conducted through the ground lead 203 via each of these resistors selected by the multi-step switch (under the control of the processing unit 110):

|        | Good Grounding | False Grounding | No Grounding |
| --- | --- | --- | --- |
| ∞      | conducting | conducting | non-conducting |
| 1 MΩ   | conducting | conducting | non-conducting |
| 5.6 KΩ | conducting | non-conducting | non-conducting |
| 200 Ω  | conducting | non-conducting | non-conducting |

If the AC mains 200 has a proper grounding, there will always be current flowing through the ground lead 203 regardless of the resistor selected (as if the question mark in the drawing is a close circuit). Inversely, if the AC mains 200 has no grounding at all, there will always be no current flowing through the ground lead 203 regardless of the resistor selected (as if the question mark in the drawing is an open circuit). On the other hand, false grounding is a special case where it can discharge a small current but fails to do so for a large current. Therefore, when a resistor of a smaller resistance is selected such as the 5.6KΩ or 200 Ω one, a very large current is supposed to occur but the false grounding of the ground lead 203 is unable to absorb it. On the other hand, when a resistor of a very large resistance such as the ∞ or 1 MΩ one, a small current is induced and can be discharged successfully through the false grounding of the ground lead 203.

Based on these principles, the processing unit 110 can automatically switch the resistors and observe the conduction condition of the ground lead 203 to determine whether the AC mains 200 has a proper grounding. A user then can be notified of the examination result of the testing member 131 by the flashing light or buzzer sound of the display and operation unit 120. The user therefore can be certain whether the AC mains 200 has provided a proper grounding for the monitoring device 100. It should be mentioned that the resistors of the loading element 1311 is not limited to the aforementioned combination of resistance values. Please also note that in the foregoing process the processing unit 110 can calculate the ground resistance $R_{203}$ of the AC mains 200 and the processing unit 110 then records the ground resistance $R_{203}$ in the non-violate memory for deriving the ground resistances of testing ground points in the periodic monitoring process.

Please note that, in real life, it is not impossible that the power lead 202 and the neutral lead 201 are inversely connected mistakenly (that is, the AC voltage actually arises from the neutral lead 201 instead of from the power lead 202). Therefore, the switch 1313 is provided to allow a user to select whether to take the power lead 202 or the neutral lead 201 as input. For example, if the power lead 202 is selected as input and no conduction is detected for all resistive loads, a user shouldn't jump to a conclusion that the AC mains 200 does not provide a proper grounding. The user should further use the switch 1313 to take the neutral lead 201 as input and examine the conduction condition of the ground lead 203 again. For example, if conduction is detected for all resistive loads when using the neutral lead 201 as input, it is obvious that the power lead 202 and the neutral lead 201 are inversely connected, and the grounding provided by the AC mains is still acceptable.

As shown in FIG. 2b, the monitoring device 100 can further contain a network interface unit 150 to deliver the interface of the display and operation unit 120 in the form of web page or in similar text or graphic interface to authorized users accessing the monitoring device 100 through a network 500. Therefore an authorized user is able to set up device parameters or read measurement results remotely. Similarly, alarms from the processing unit 110 can also be presented to a remote user in this way. The network 500 is an abstraction of various types of networks, such as a wired or wireless LAN, a proprietary WAN via a wired or wireless LAN, the Internet, or a mobile data network (such as a 2.5 G or 3 G mobile communications network). Accordingly, the network interface unit 150 should contain a physical port and support a communication protocol compatible to the network 500. In addition to passively waiting for user's examination, the network interface unit 150 can also proactively deliver alarms to one or more specific users via, for example, electronic mails, short messages, or even direct dialing with simulated or pre-recorded voice clips.

To use the monitoring device 100, first the monitoring device 100 is connected to the AC mains 200 (usually a wall outlet) and then a testing mode of the monitoring device is activated to confirm if the ground lead 203 of the AC mains 200 is properly grounded and the ground resistance of the AC mains 200 is obtained and recorded. If the AC mains 200 has a proper grounding, then, the conductive wire 300 is used to connect one of the test ground points 400 to one of the monitoring ports 141. If some conductive wires 300 are too long, the monitoring device 100 can be entered into the foregoing calibration mode to estimate and record the wire resistance of each conductive wire 300. Subsequently, the user enters the safety range of each monitoring port 141 and activates the monitoring device 100 to periodically measure and compare ground resistance of each test ground point 400 with the safe range and to alarm when the ground resistance exceeds its corresponding safe range.

If the monitoring device 100 is equipped with the network interface unit 150, the foregoing process further contains the step of appropriately connecting the monitoring device 100 to the network 500 and setting up relevant parameters such as IP (internet protocol) address, mask, and gateway, etc.

Although the present invention has been described with reference to the preferred embodiments, it will be understood that the invention is not limited to the details described thereof Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A ground resistance monitoring device for measuring ground resistances of a plurality of test ground points, comprising:

a display and operation unit having at least a display and a keypad as a man-machine interface of said ground resistance monitoring device;

a processing unit having two-way connection to the other units for exchanging data therebetween;

a testing and power supply unit connected to a neutral lead, a power lead, and a ground lead of an AC mains for regulating and rectifying said AC power, and providing said regulated and rectified power to the other units of said ground resistance monitoring device, said testing and power supply unit capable of determining a grounding condition and obtaining a ground resistance of said ground lead of said AC mains, said testing and power supply unit providing an appropriate voltage source for measuring ground resistances of said test ground points;

a measurement unit having a plurality of monitoring ports, each said monitoring port connected to a said test ground point through a conductive wires;

wherein, under a monitoring mode of said ground resistance monitoring device, said processing unit periodically selects a said monitoring port and forms an electrical path from said voltage source, through said monitoring port, a said conductive wire connected to said monitoring port, a said test ground point connected to said conductive wire, to said ground lead of said AC mains via earth for obtaining a measurement result of a ground resistance of said test ground point, and said processing unit compares said measurement result to a safety range of said monitoring port and issues an alarm when said measurement result exceeds said safety range; and a second ground port, wherein, under a calibration mode of said ground resistance monitoring device, said processing unit selects a said monitoring port and forms an electrical path from said voltage source, through said monitoring port, a said conductive wire connected to said monitoring port, a said test ground point connected to said conductive wire, to said second ground port via a second conductive wire substantially identical to said conductive wire for obtaining a wire resistance of said conductive wire by dividing a second measurement result of said test ground point by two.

2. The ground resistance monitoring device according to claim 1, wherein said safety range is defined by a minimum acceptable ground resistance and a maximum acceptable ground resistance.

3. The ground resistance monitoring device according to claim 1, wherein, under a second monitoring mode of said ground resistance monitoring device, said processing unit selects a said monitoring port and forms an electrical path from said voltage source, through said monitoring port, a said conductive wire connected to said monitoring port, a said test ground point connected to said conductive wire, to a ground connected to said second ground port via earth for obtaining a measurement result of a ground resistance of said test ground point.

4. The ground resistance monitoring device according to claim 1, wherein, under said monitoring mode of said ground resistance monitoring device, said measurement result of said ground resistance of said test ground point is deducted by said wire resistance of said conductive wire before said safety range is compared against.

5. The ground resistance monitoring device according to claim 1, wherein said testing and power supply unit has a plurality of resistive loads; under a testing mode of said ground resistance monitoring device, an AC power from said AC mains is conducted through each said resistive load to said ground lead of said AC mains; and, by observing a conducting condition of said ground lead, said ground lead is classified into one of the following grounding conditions: proper grounding, no grounding, and false grounding.

6. The ground resistance monitoring device according to claim 1, wherein said testing and power supply unit has a switch for selecting one of said power lead and said neutral lead as an input of said AC power.

7. The ground resistance monitoring device according to claim 1, further comprising a network interface unit connected to a network wherein an operation interface is presented to an user accessing said ground resistance monitoring device through said network.

8. The ground resistance monitoring device according to claim 7, wherein said alarm is sent a specific user through said network by at least one of the following means: an electronic mail, a short message, and a direct-dialing voice message.

9. The ground resistance monitoring device according to claim 1, wherein said display and operation unit has one of a visual and an audible means for presenting said alarm.

* * * * *